United States Patent
Lin et al.

(10) Patent No.: US 10,193,302 B2
(45) Date of Patent: Jan. 29, 2019

(54) LIGHT ENGINE WITH INTEGRATED TURNING MIRROR FOR DIRECT COUPLING TO PHOTONICALLY-ENABLED COMPLEMENTARY METAL-OXIDE SEMICONDUCTOR (CMOS) DIE

(71) Applicant: Applied Optoelectronics, Inc., Sugar Land, TX (US)

(72) Inventors: Kai-Sheng Lin, Sugar Land, TX (US); Justin Lii, Houston, TX (US); Ziliang Cai, Richmond, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 15/591,166

(22) Filed: May 10, 2017

(65) Prior Publication Data
US 2018/0331493 A1 Nov. 15, 2018

(51) Int. Cl.
| | |
|---|---|
| G02B 6/38 | (2006.01) |
| G02B 6/42 | (2006.01) |
| H01S 5/022 | (2006.01) |
| H04B 10/50 | (2013.01) |
| H04B 10/60 | (2013.01) |

(52) U.S. Cl.
CPC ........ *H01S 5/02248* (2013.01); *G02B 6/3885* (2013.01); *G02B 6/3893* (2013.01); *G02B 6/4246* (2013.01); *G02B 6/4295* (2013.01); *H01S 5/0224* (2013.01); *H01S 5/02288* (2013.01); *H01S 5/02292* (2013.01); *H04B 10/50* (2013.01); *H04B 10/60* (2013.01)

(58) Field of Classification Search
CPC .................................................. H01S 5/02248
See application file for complete search history.

(56) References Cited

U.S. PATENT DOCUMENTS

| | | | |
|---|---|---|---|
| 6,219,470 B1 * | 4/2001 | Tu ........................ | G02B 6/4204 385/14 |
| 7,129,163 B2 * | 10/2006 | Sherrer ................ | G02B 6/4201 438/637 |
| 8,168,939 B2 | 5/2012 | Mack et al. | |
| 9,213,155 B2 * | 12/2015 | Miao ...................... | G02F 1/093 |
| 9,774,172 B1 * | 9/2017 | Ayliffe ................. | H01S 5/4075 |
| 2004/0188788 A1 * | 9/2004 | Yang .................... | G02B 6/4214 257/432 |

* cited by examiner

*Primary Examiner* — Omar R Rojas
(74) *Attorney, Agent, or Firm* — Grossman Tucker Perreault & Pfleger, PLLC; Norman S. Kinsella

(57) ABSTRACT

A light engine is disclosed that includes an optical bench with a mirror etched therefrom to form a single, unitary structure. The integrated mirror may therefore be pre-aligned with an associated light path to reduce light path alignment errors. In an embodiment, the optical bench includes a first end extending to a second end along a longitudinal axis, a laser diode disposed on a mounting surface adjacent the first end of the optical bench and configured to output laser light along a first light path that extends substantially along the longitudinal axis, and an integrated mirror device disposed along the light path to receive and direct the laser light along a second light path to optically couple the laser light to a photonically-enabled complementary metal-oxide semiconductor (CMOS) die, the second light path being substantially orthogonal relative to the first light path.

18 Claims, 9 Drawing Sheets

LIGHT ENGINE WITH INTEGRATED TURNING MIRROR FOR DIRECT COUPLING TO PHOTONICALLY-ENABLED COMPLEMENTARY METAL-OXIDE SEMICONDUCTOR (CMOS) DIE

TECHNICAL FIELD

The present disclosure relates to optical transmitters and transceivers, and more particularly, to a light engine having an integrated optical bench and mirror device to emit and couple laser light into an associated complementary metal-oxide semiconductor (CMOS) die.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to thermal management, insertion loss, and manufacturing yield.

Optical transceiver modules generally include one or more transmitter optical subassemblies (TOSAs) for transmitting optical signals. One approach to TOSAs includes coupling a laser diode, lens, and rotator disposed on an optical bench. These types of TOSAs can couple to a CMOS chip and provide emitted laser light at a particular angle into the same. In turn, the CMOS chip can include a gratings coupler for receiving the emitted laser light and launching the same into, for instance, a fiber. This direct-coupling approach may significantly reduce loss and improve coupling efficiency. However, as TOSAs continue to scale the design and manufacture of such direct-coupling TOSA devices raises numerous non-trivial challenges.

BRIEF DESCRIPTION OF THE DRAWINGS

These and other features and advantages will be better understood by reading the following detailed description, taken together with the drawings wherein.

DETAILED DESCRIPTION

Some approaches to transmitter optical subassemblies (TOSAs) include using Silicon Photonics (SiP) technology. SiP devices can include an optical bench having a plurality of optical components for generating, focusing, and optically coupling laser light into CMOS chips, which may then couple laser light into an external fiber for transmission. Such SiP devices may achieve higher coupling efficiency relative to other approaches to TOSA devices.

Figure 2:
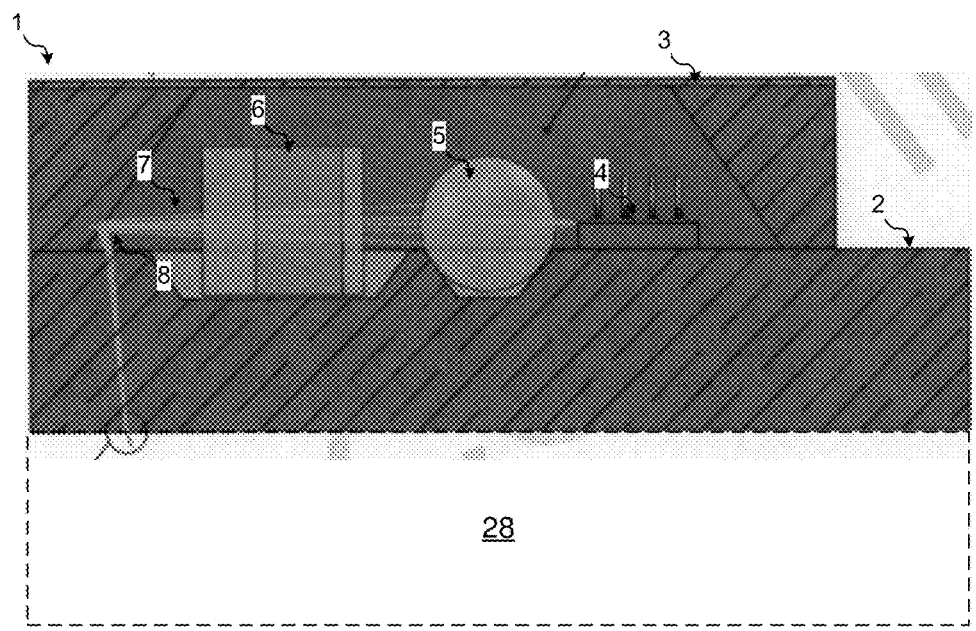
FIG. 2 shows a cross-sectional view of a light engine that utilizes a lid portion to turn laser light towards a CMOS chip.

For example, FIG. 2 shows an example light engine 1 that implements a SiP architecture. The light engine 1 includes an optical bench 2, which may also be referred to as a base 2, coupled to a lid portion 3 with a cavity being formed there between. The light engine 1 couples to the CMOS chip 28, with the CMOS chip 28 having one or more waveguides/gratings to couple laser light into a transmit fiber (not shown). The cavity includes a laser diode 4, a lens 5, an optical isolator 6, and a turning mirror 8. The lens 5, optical isolator 6, and mirror 8 are aligned along an optical path, generally shown at 7, to receive laser light emitted by the laser diode 4. To "turn" the laser light towards the CMOS chip 28, the lid portion 3 defines an angled surface to form the mirror device 8. Thus, in operation, light traveling along the light path 7 intersects with the angled surface and is reflected towards the CMOS chip due to total internal reflection.

As light engines continue to scale, optically aligning the mirror device 8 with the light path 7 remains a complicated procedure as the lid portion 3 must be properly aligned relative to the base 2. Incorrect alignment even in the tens of microns may significantly reduce power and ultimately reduce manufacturing yield.

Thus, in accordance with an embodiment, a light engine is disclosed that features an optical bench with an integrated mirror device to form a single, unitary structure. The integrated mirror device may therefore be pre-aligned with an associated light path to advantageously eliminate or otherwise reduce light path alignment errors. In an embodiment, the light engine includes an optical bench that extends from a first end to a second end along a longitudinal axis. A surface of the optical bench may define a laser diode section, a lens holder section, an optical isolator section, and an integrated mirror section. A first light path may extend substantially in parallel with the longitudinal axis and be aligned with optical components of the optical bench such that laser light emitted by the laser diode is aligned with a lens of the lens section, an optical isolator of the isolator section, and a mirror device of the mirror section. The mirror device includes an angled surface for refracting incident laser light along a second light path that is substantially orthogonal relative to the first light path. The second light path may then pass through a surface of the optical bench that intersects with the CMOS chip to optically couple laser light into a grating/waveguide of the CMOS chip.

In an embodiment, the laser diode includes an epi-up configuration whereby laser light emits from an upper surface/region of the laser diode relative to a surface defining the optical bench. In this embodiment, the integrated mirror device may include a mesa structure defined by at least a first surface that faces the laser diode and is angled relative to the light path to cause laser light encountering the same to intersect at a specific angle relative to normal. The angled surface may intersect with and extend through the light path to ensure that laser light traveling along the light path encounters the angled surface. The particular angle of the angled surface may be selected to cause a substantial portion of laser light, e.g., at least 80%, to be refracted into a body of the mirror device. A second surface, opposite the first surface, of the mesa may be angled relative to the light path to cause light refracted by the first surface to be refracted again towards the base/bottom of the optical bench. To this end, a bottom, or light-emitting surface of the optical bench may output light into a CMOS chip.

In another embodiment, the laser diode includes an epi-down configuration whereby laser light emits from a surface/region of the laser diode that is proximal to a surface of the optical bench. In this embodiment, a first mesa structure may at least partially define a lens holder cavity and optical isolator cavity. In addition, a second mesa structure may define the mirror device. To accommodate the laser light being emitted relatively close to surfaces of the optical bench along the light path, a channel/cavity may be etched/formed proximal to the surface coupled to the laser diode to prevent obstruction of emitted laser light. In addition, the first mesa proximal to the laser diode may include a section etched out to form a channel/cavity, thus allowing laser light to travel along the light path unobstructed by the optical bench. Continuing on, an angled surface of the mirror device may intersect with and extend through the light path to ensure that laser light traveling along the light path encounters the angled surface. The particular angle of the angled surface may be selected to cause a substantial portion of laser light, e.g., at least 80%, to be refracted into a body of the mirror device. A second surface, opposite the first surface, of the mesa may be angled relative to the light path to cause light refracted by the first surface to be refracted again towards the base/bottom of the optical bench. To this end, a bottom, or light-emitting surface of the optical bench may output light into a CMOS chip. The epi-down configuration may further allow the second mesa that defines the mirror device to be dimensioned relatively smaller than the epi-up configuration, which may reduce the overall profile of the laser device.

As used herein a mesa or mesa shape refers to a shape with an elevated section having sides that extend up to and intersect with a surface defining a substantially flat top. The sides extending to the substantially flat top may be angled relative to each other, e.g., each extends along a line that intersects.

As used herein, a "ball lens" is a lens having a substantially spherical outer shape but is not required to be a perfect sphere. As used herein, a "cuboid type TO package" refers to a laser package structure having a generally cuboid or parallelepiped outer shape formed by at least three substantially flat and orthogonal outer surfaces. For clarification, the term "TO" or "transistor outline" is derived from a reference to the traditional cylindrical package or "can" that historically encased a transistor, but as used herein, is otherwise unrelated to such transistor packages. As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. The term "coupled" as used herein refers to any connection, coupling, link, or the like and "optically coupled" refers to coupling such that light from one element is imparted to another element. Such "coupled" devices are not necessarily directly connected to one another and may be separated by intermediate components or devices that may manipulate or modify such signals.

Example Transceiver Systems

Figure 1A:
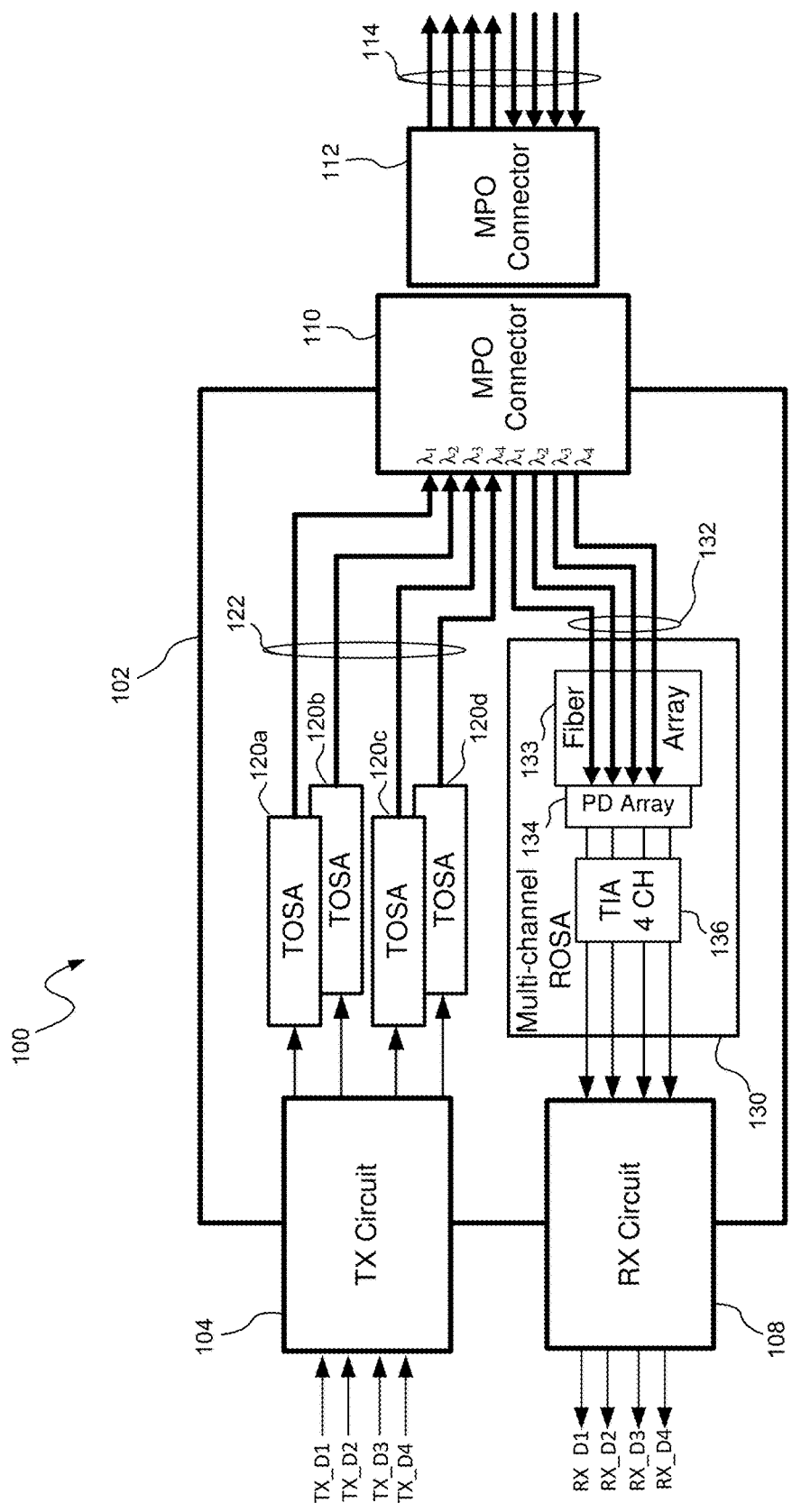
FIGS. 1A and 1B are block diagrams of multi-channel optical transceivers, consistent with embodiments of the present disclosure.

Referring to FIG. 1A, an optical transceiver 100, consistent with embodiments of the present disclosure, is shown and described. In this embodiment, the optical transceiver 100 transmits and receives four (4) channels using four different channel wavelengths ($\lambda 1$, $\lambda 2$, $\lambda 3$, $\lambda 4$) and may be capable of transmission rates of at least about 25 Gbps per channel. In one example, the channel wavelengths $\lambda 1$, $\lambda 2$, $\lambda 3$, $\lambda 4$ may be 1270 nm, 1290 nm, 1310 nm, and 1330 nm, respectively. The optical transceiver 100 may also be capable of transmission distances of 2 km to at least about 10 km. The optical transceiver 100 may be used, for example, in internet data center applications or fiber to the home (FTTH) applications.

This embodiment of the optical transceiver 100 includes multiple transmitter optical subassemblies (TOSAs) 120a-d for transmitting optical signals on different channel wavelengths and a multi-channel receiver optical subassembly (ROSA) 130 for receiving optical signals on different channel wavelengths. The TOSAs 120a-d and the multi-channel ROSA 130 are located in a transceiver housing 102.

A transmit connecting circuit 104 and a receive connecting circuit 108 provide electrical connections to the TOSAs 120a-d and the multi-channel ROSA 130, respectively, within the housing 102. The transmit connecting circuit 104 is electrically connected to the electronic components (e.g., the laser, monitor photodiode, etc.) in each of the TOSAs 120a-d and the receive connecting circuit 108 is electrically connected to the electronic components (e.g., the photodiodes, the TIA, etc.) in the multi-channel ROSA 130. The transmit connecting circuit 104 and the receive connecting circuit 108 may be flexible printed circuits (FPCs) including at least conductive paths to provide electrical connections and may also include additional circuitry.

A multi-fiber push on (MPO) connector 110 provides optical connections to the TOSAs 120a-d and the multi-channel ROSA 130 within the housing 102. The MPO connector 110 is optically coupled to the TOSAs 120a-d and the multi-channel ROSA 130 via transmit optical fibers 122 and receive optical fibers 132, respectively. The MPO connector 110 is configured to be coupled to a mating MPO connector 112 such that the optical fibers 122, 132 in the optical transceiver 100 are optically coupled to external optical fibers 114.

Each of the TOSAs 120a-d may be implemented as light engine 300A and/or light engine 300B, discussed in greater detail below. Each light engine includes an optical bench or base, e.g., formed from Silica or other suitable material, and is configured to couple to a photonically-enabled complementary metal-oxide semiconductor (CMOS) die/chip. Each light engine may be electrically coupled to conductive paths on the transmit connecting circuit 104 and optically coupled to a respective CMOS chip. Each CMOS chip may include gratings/waveguides to couple laser light from associated light engines to one of the optical fibers 122. One example CMOS chip is discussed in greater detail below with reference to FIG. 7.

In more detail, each optical bench may include a laser diode and a plurality of optical components, e.g., a lens and optical isolator, aligned along a light path to emit and focus laser light. The laser diode of each laser engine may be, for instance, epitaxially grown on a section of the optical bench, or alternatively formed/grown off-chip and coupled to each optical bench, and be configured to emit a specific associated channel wavelength. Each of the optical benches include an integrated mirror/turning device at an end of the light path opposite the laser diode for "turning" laser light received via the same along a light path that extends through at least a portion of the optical bench towards an associated CMOS die. A surface of the optical bench may thus be a light-emitting surface or port to output laser light into an adjacent CMOS die.

The integrated mirror device of each optical bench may advantageously be formed as a single piece from the optical bench via etching or another suitable process. For example, photolithography may be utilized to hard mask and etch portions of the optical bench to form the mirror device as well as other structures, e.g., a lens holder cavity for receiving and aligning a lens with the light path and an optical isolator cavity for receiving and aligning with the light path, via such patterning and etching. Therefore, the integrated mirror and optical bench may comprise the same material to collectively form an integrated optical bench assembly having a monolithic/unitary structure. The integrated mirror device may be formed with a mesa shape. As discussed in detail below with reference to FIGS. 4 and 6, the angle of the sides of the mesa may be utilized to cause refraction of light to turn/redirect channel wavelengths towards an associated CMOS chip.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise expressly provided by the present disclosure.

Continuing on, this embodiment of the multi-channel ROSA 130 shown in FIG. 1A includes a photodetector array 134 including, for example, photodiodes optically coupled to a fiber array 133 formed by the ends of the receive optical fibers 132. The multi-channel ROSA 130 also includes a multi-channel transimpedance amplifier 136 electrically connected to the photodetector array 134. The photodetector array 134 and the transimpedance amplifier 136 detect and convert optical signals received from the fiber array 133 into electrical data signals (RX_D1 to RX_D4) that are output via the receive connecting circuit 108. Other embodiments of a ROSA may also be used in the transceiver 100 for receiving and detecting one or more optical signals.

This embodiment of the optical transceiver 100 does not include an optical multiplexer or demultiplexer. The optical signals may be multiplexed and demultiplexed external to the optical transceiver 100.

Figure 1B:
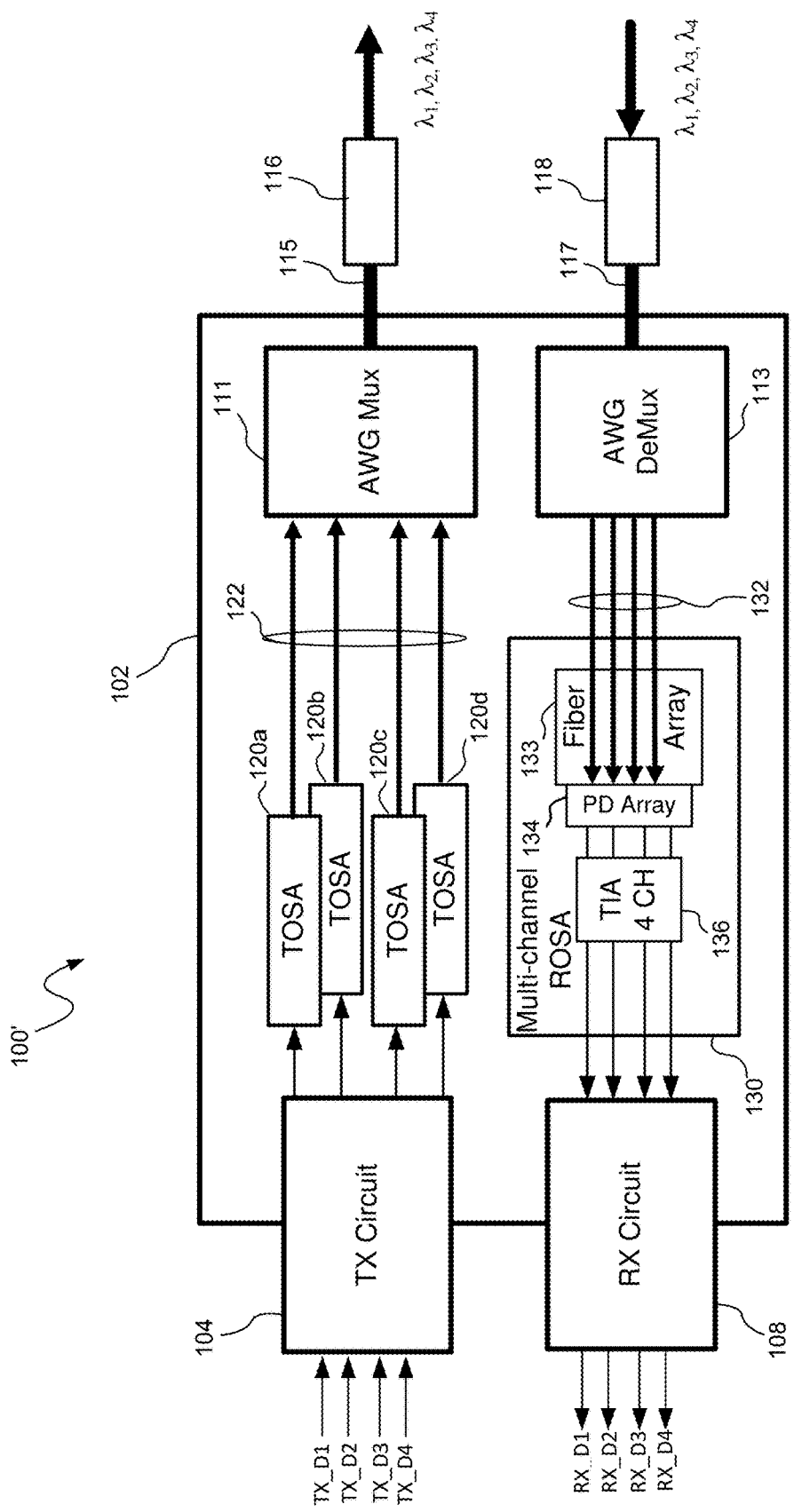

Referring to FIG. 1B, another embodiment of an optical transceiver 100' includes the same light engine (e.g., TOSAs 120a-d and ROSA 130) described above together with an optical multiplexer 111 and an optical demultiplexer 113. The optical multiplexer 111 and the optical demultiplexer 113 both may include arrayed waveguide gratings (AWGs). The optical multiplexer 111 is optically coupled to the transmit optical fibers 122 and the optical demultiplexer 113 is optically coupled to the receive optical fibers 132. The optical multiplexer 111 multiplexes the optical signals being transmitted over transmit optical fibers 122 to provide a multiplexed optical signal on an output optical fiber 115. The optical demultiplexer 113 demultiplexes a multiplexed optical signal received on an input optical fiber 117 to provide received optical signals on receive optical fibers 132. The output optical fiber 115 and the input optical fiber 117 are coupled to an output optical connector 116 and an input optical connector 118, respectively.

This embodiment of the optical transceiver 100' includes 4 channels and may be configured for coarse wavelength division multiplexing (CWDM), although other numbers of channels are possible. This embodiment of the optical transceiver 100' may also be capable of transmission rates of at least about 25 Gbps per channel and transmission distances of 2 km to at least about 10 km and may be used in internet data center applications or fiber to the home (FTTH) applications.

Example Light Engine Assemblies

Referring now to FIGS. 3A-3E, a light engine 300A is shown in accordance with an embodiment of the present disclosure. The light engine 300A may be suitable for use as TOSA modules within the optical transceivers of systems 100, 100' of FIGS. 1A and 1B, respectively. As shown, the light engine 300A includes an optical bench 309 (or base 309) that extends from a first end 318-1 to a second end 318-2 along a longitudinal axis 316. The optical bench 309 includes a laser diode section adjacent the first end 318-1 followed by a lens holder section, an optical isolator section, and a light turning section. The optical bench 309 may comprise, for example, Silicon (Si), Silicon Dioxide ($SO_2$) which is also known as Silica, or any other suitable substrate such as Silicon Nitride (Si3N4). The light engine 300A may be referred to as a Silicon Photonic (SiP) device. The optical bench 309 may be formed via semiconductor process techniques using photolithography, for example. One example process suitable for forming the optical bench 309 is discussed in greater detail below.

The optical bench 309 includes a first and second electrical pad 315-1 and 315-2, respectively, adjacent the first end 318-1 in the laser diode section. The first and second electrical pads 315-1, 315-2 couple to an associated laser driver, e.g., transmit connecting circuit 104, and may be used to provide a drive signal to the laser diode 301. The optical bench 309 further includes electrical pads 314-1 and 314-2 disposed on the surface 321, with the first and second electrical pads 314-1, 314-2 being disposed on opposite sides of the optical bench 309 and extending in parallel relative to each other along the longitudinal axis 316. The electrical pads 314-1, 314-2 and 315-1, 315-2 may comprise, for example, one or more layers of Titanium (Ti), Platinum (Pt), Gold (Au), or any alloy thereof. One such example alloy includes Titanium Tungsten (TiW). Wires, such as wire bonds 302, may couple the laser diode chip 301 to the second electrical pad 315-2.

Figure 5A:
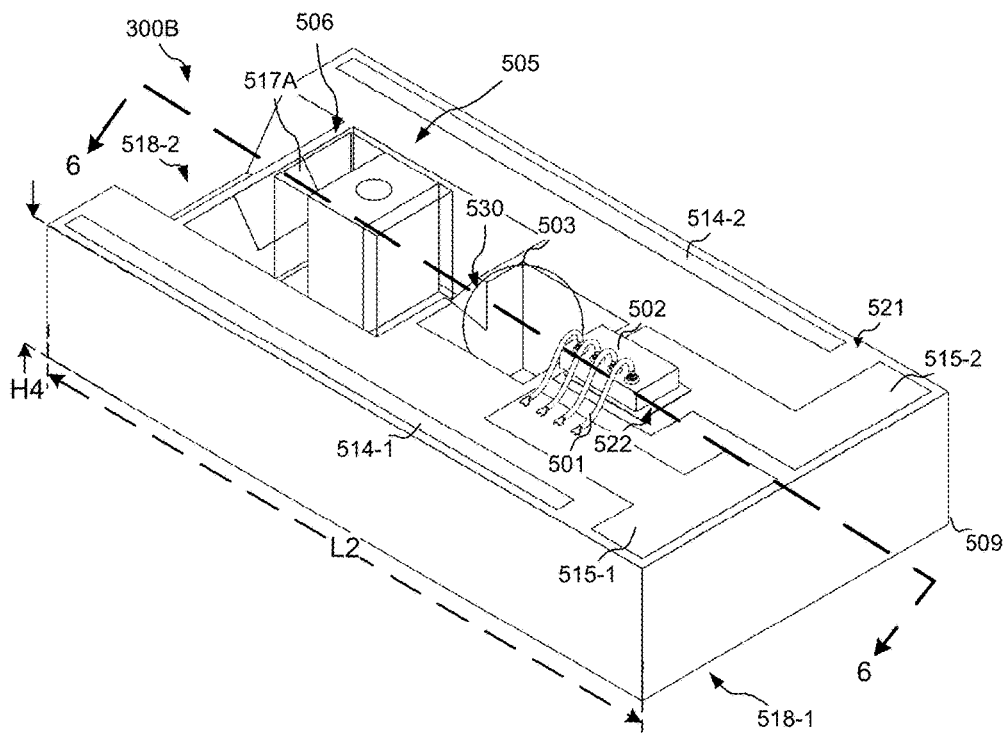
FIGS. 5A-5D collectively show an example light engine configured in accordance with an embodiment of the present disclosure.

The laser diode section further includes a laser diode mounting surface 322 or region disposed on the surface 321. The laser diode mounting region 322 may comprise, for example, one or more layers of Platinum (Pt), Gold (Au), Tin (Sn), or any alloy thereof. For example, the laser diode mounting surface 322 may comprise a Gold-Tin (AuSn) alloy. A laser diode chip 301 is coupled to the laser diode mounting region 322. In an embodiment, the laser diode 301 comprises an epi-up bonded laser with an epitaxial-side metallization structure that operationally results in laser light being emitted from a "top" edge/surface of the laser diode 301, with the light-emitting surface/edge being disposed opposite a surface of the laser diode 301 that couples the same to the surface 335 of the optical bench 309. In other embodiments, the laser diode 301 may be formed as an epi-down bonded laser such as shown in FIGS. 5A-6, which are discussed in further detail below. In these embodiments, light may be emitted from a portion of the laser diode 501 which is proximal to the surface 535, e.g., see FIG. 6. Accordingly, and as discussed further below, channels may be etched/formed into the optical bench to allow laser light to travel along the light path 513 without obstruction by the optical bench 509.

Figure 4:
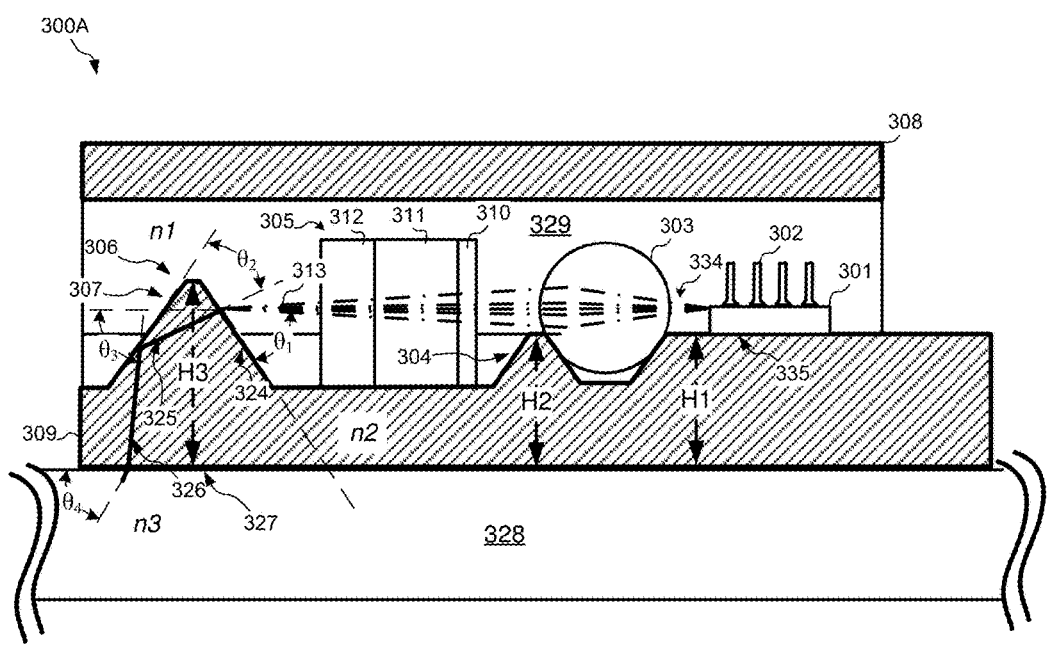
FIG. 4 is a cross-sectional view of the light engine of FIG. 3A taken along the line 4-4 in accordance with an embodiment of the present disclosure.

Continuing on, a trench 323 (or cavity 323) is disposed adjacent to and surrounds at least a portion of the laser diode mounting region 322. The trench 323 may be formed via, for example, wet etching or another suitable process and may be used as a solder dam. Adjacent the trench, a lens holder cavity 319 in the lens holder section receives lens 303 and is dimensioned to position the lens 303 in substantial alignment with the laser diode 301 for optically coupling laser output from the laser diode 301 onto a light path 313 extending along longitudinal axis 316 and eventually into gratings/waveguides of CMOS chip 328 (FIG. 4). The lens holder cavity 319 may be formed via wet etching or another suitable process. As shown, the lens holder cavity 319 tapers to form a platform for receiving and supporting the lens 303.

Adjacent the lens holder section, an optical isolator section includes an optical isolator cavity 320. The optical isolator cavity 320 in the optical isolator section receives optical isolator 305 and is dimensioned to allow the optical isolator 305 to align with and receive laser light from the lens 303. In an embodiment, the optical isolator cavity 320 includes tapered sidewalls. As shown, the optical isolator 305 includes a plurality of sections including a polarizer section 310, a faraday rotator section 311, and a polarizer section 312. Other configurations for the isolator 305 are also within the scope of this disclosure and the example shown should not be construed as limiting. Adjacent the optical isolator section a light turning (or mirror) section is disposed. Accordingly, the optical engine 300A provides a coaxial configuration whereby a laser diode 301, lens 303, optical isolator 305, and a mirror device 306 are disposed along and are aligned with a first light path 313.

The light turning section includes a mirror device 306, which may be integrally formed from the optical bench 309 as a single piece via, for example, wet etching or another suitable process. The mirror device 306 and the optical bench 309 may thus collectively form an integrated optical bench assembly. In addition, the light engine 300A may include a coaxial configuration whereby each of the laser diode chip 301, lens 303, optical isolator 305, and mirror device 306 are each aligned and disposed along the first light path 313. A lid portion 308 may be coupled to the surface 321 of the optical bench 309. In this embodiment, the lid portion 308 may be used to hermetically seal the cavity 329, although other embodiments are within the scope of this disclosure. For example, the light engine may include an opening 332 that partially exposes optical components of the light engine 300A, such as shown in FIG. 3E.

As shown, the mirror device 306 extends from a surface of the optical bench 309 to and has a mesa shape. The mirror device 306 may be dimensioned such that a portion thereof extends through the first light path 313, and at an intersection therebetween, the mirror device 306 receives laser light and redirects/turns the same along a second light path 325 which is substantially orthogonal relative to the first light path 313, which is shown more clearly in FIG. 4. At the intersection between the first light path 313 and the mirror device 306, an optical window 317 may include one or more anti-reflective coating layers to prevent back reflection, for instance.

Figure 3A:
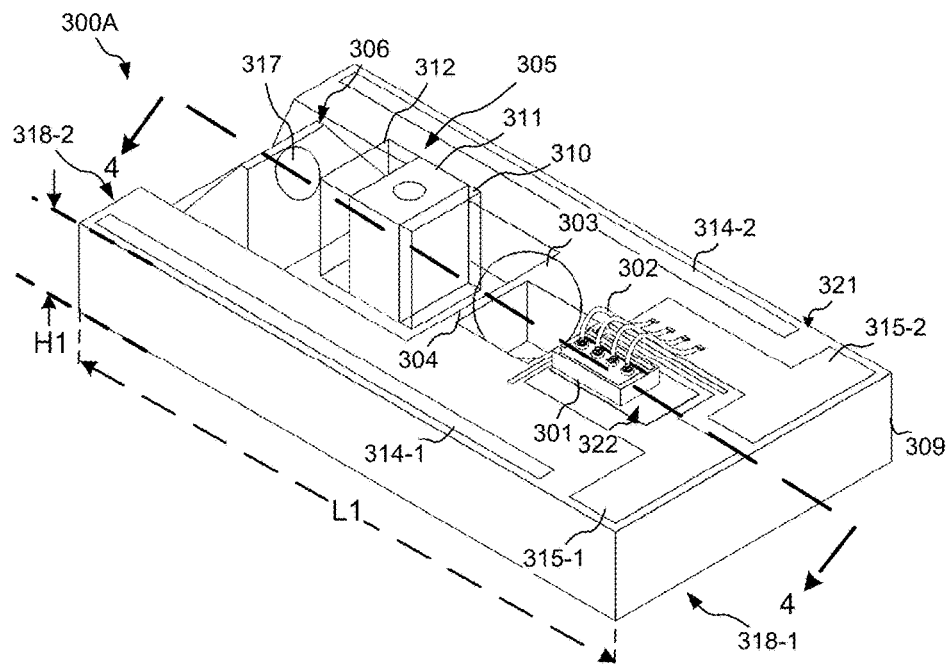
FIGS. 3A-3E collectively show an example light engine configured in accordance with an embodiment of the present disclosure.
Figure 3B:
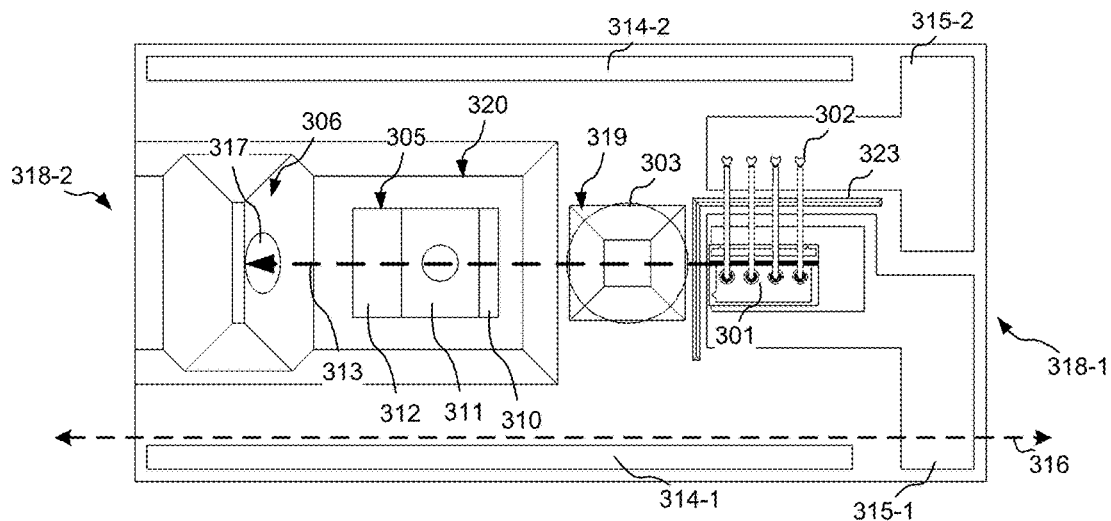
Figure 3C:
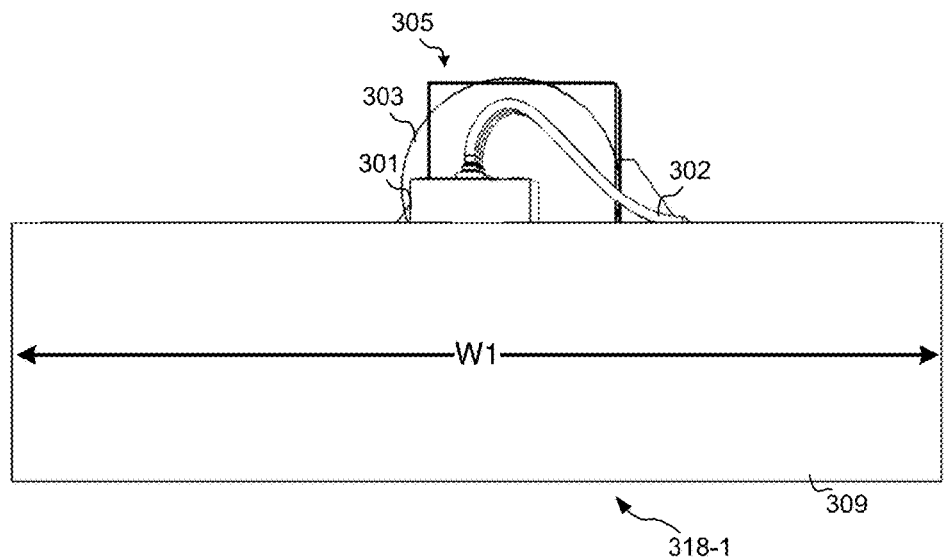
Figure 3D:
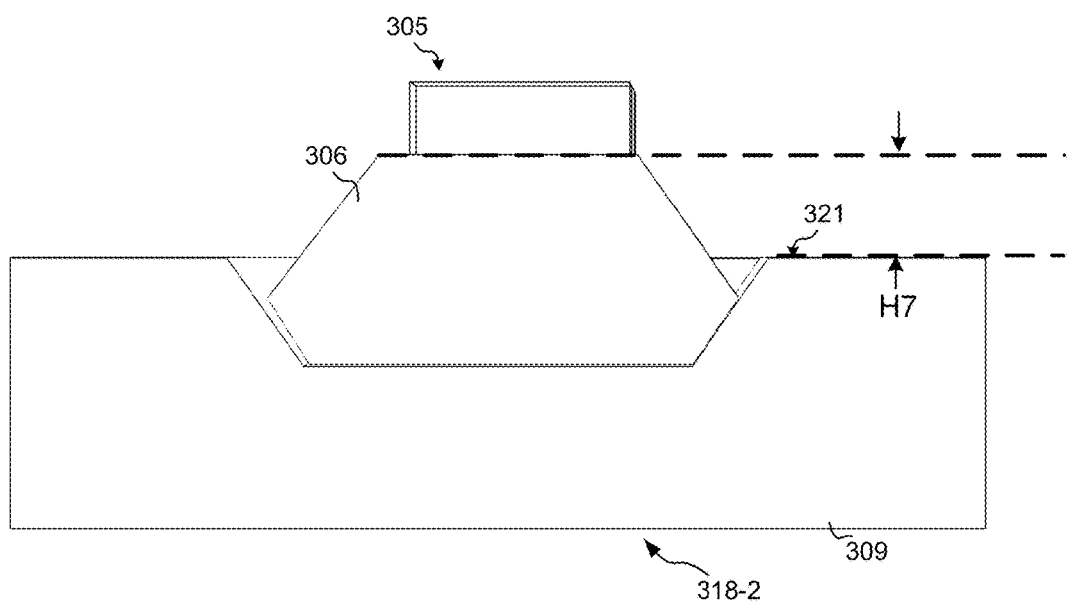
Figure 3E:
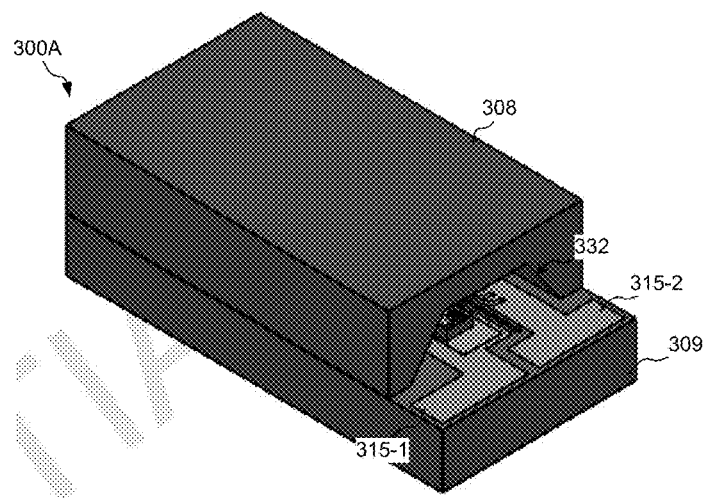

Turning to FIG. 4, with additional reference to FIGS. 3A-3E, a cross-sectional view of the light engine 300A taken along the line 4-4 of FIG. 3A is shown in accordance with an embodiment. As shown, laser light 334 emitted by the laser diode chip 301 extends along a first light path 313, with the first light path 313 extending substantially in parallel with the longitudinal axis 316 through the lens 303, optical isolator 305, and intersecting with the integrated mirror device 306 (or mirror device 306) at a light incident surface 324, and more particularly, the optical window 317. A reflective surface 307 of the mirror device 306 is disposed opposite the light incident surface 324. As shown, the light incident surface 324 faces the optical isolator 305, lens 303 and laser diode 301. The light incident surface 324 is angled at a first angle $\theta_1$ relative to the light path 313, with the first angle $\theta_1$ being 55 degrees±10 degrees. The first angle $\theta_1$ may thus cause incident light to be angled relative to normal and, thus, be configured to cause incident laser light to refract into a body/core of the mirror device 306. For example, and in accordance with an embodiment, the mirror device 306 may comprise Silica with a refractive index (n2) ranging from 1.5 to 1.4. On the other hand, the cavity 329 may comprise air with a refractive index (n1) of about 1.0. Using Snell's law, the angle of refraction is given by the following equation:

$$\sin^{-1}\left(\frac{n1 * \sin(\theta_1)}{n2}\right) = (\theta_2) \qquad \text{Equation (1)}$$

where n1 is the refractive index of the first medium, n2 is the refractive index of the second medium, $\theta_1$ is the angle of incidence for laser light relative to normal, and $\theta_2$ is the resulting angle of refraction. Thus, using the previous example where the cavity 329 comprises air and the mirror device 306 comprises Silica, and angle $\theta_1$ equals about 55 degrees±10 degrees, the resulting angle $\theta_2$ may thus measure approximately 29 degrees±10 degrees relative to the first light path 313.

Thus, light traveling along the first light path 313 encounters the angled surface 324 of the mirror device 306 and refracts downwards towards the reflective surface 307 along the second light path 325. At an interface between the cavity 329 and the reflective surface 307, laser light again refracts. For example, using Equation (1) above, the third angle $\theta_3$ may be calculated as approximately 83 degrees±10 degrees relative to the light path 313. Thus, the mirror device 306 may be configured to refract and turn laser light orthogonally relative to the first light path 313.

At an interface between the CMOS chip 328 and the optical bench 309, laser light may again be refracted due to the refractive index n3 of the CMOS chip 328 being different than the refractive index n2 of the optical bench. For example, the CMOS chip 328 may comprise Silicon with a refractive index of about 3.97, thus resulting in laser light being refracted at a fourth angle $\theta_4$, with the fourth angle $\theta_4$ measuring about 67 degrees. In some example embodiments, 67 degrees may be particularly well suited for laser light aligning with and entering gratings/waveguides (not shown) of the CMOS chip 328 to ensure optical coupling efficiency. The surface 327, and in particular the intersection between the third light path 326 and the surface 327, may be referred to as a light-emitting output interface or simply as a light output port. Other configurations may be implemented in accordance with the present disclosure to achieve a particular output angle, e.g., the fourth angle $\theta_4$. Likewise, the particular dimensions, angles, and materials/medium chosen for the mirror device 306, the cavity 329, and the CMOS chip 328 may be selected based on a desired output angle, e.g., the fourth angle $\theta_4$, for laser light and the provided examples are not intended to be limiting. In addition, one or more coatings may be applied to adjust the refractive index of the various mediums used to refract/reflect laser light. For instance, one or more optional layers of coating may be deposited on the surface 307 in a blanket, e.g., covering the entirety of surface 307, or selective fashion, e.g., covering only a portion of the surface 307. To this end, the index of refraction for surface 307 may be different than the index of refraction for the surface 324.

In an embodiment, the overall length of the optical bench L1 (see FIG. 3A) measures 3500 microns (μm)±20 μm. The height H1 of the laser diode section measures 500 microns (μm)±20 μm. The height H2 of the first mesa 304 may be substantially equal (e.g., within 20% or less) of the height H1 of the laser diode section, although the height H2 may be less than the first mesa 304 depending on a desired configuration. The height of the second mesa H3, which generally defines the mirror device 306, measures 700 μm±20 μm. Thus the height at which the second mesa H3 extends from the surface 321 measures 200 μm±2θμm, which is shown more clearly in FIG. 3D. In some embodiments, the ratio of the height H3 relative to the height H2 and/or the height H1 is 1.4:1.0, although other ratios are within the scope of this disclosure. For instance, the ratio of the height H3 relative to the height H2 and/or the height H1 may be within a range of ratios including 1.1:1.0 to 2.0:1.0, including all ratios therebetween.

Figure 5B:
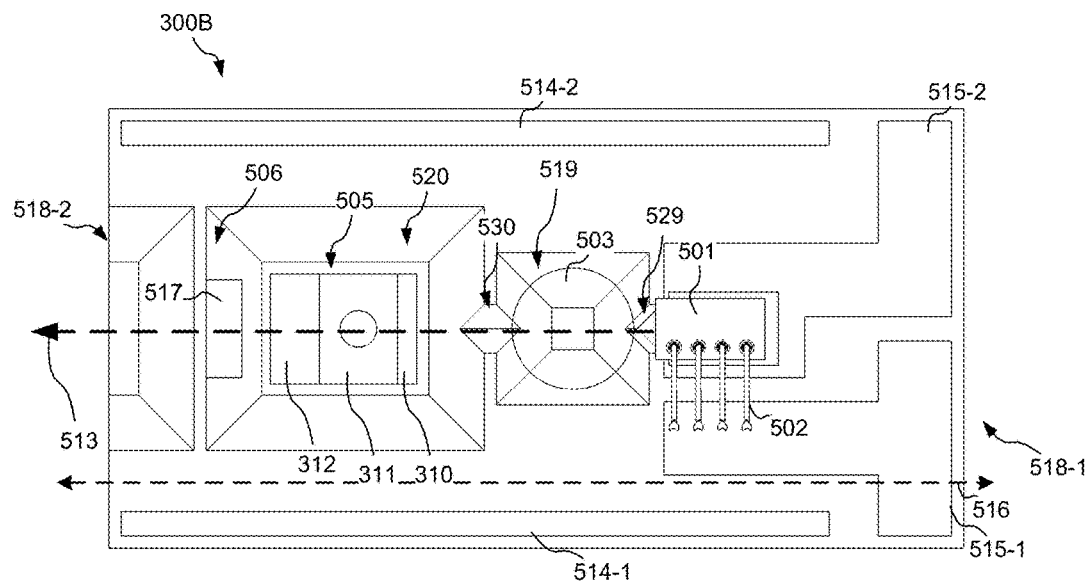
Figure 5C:
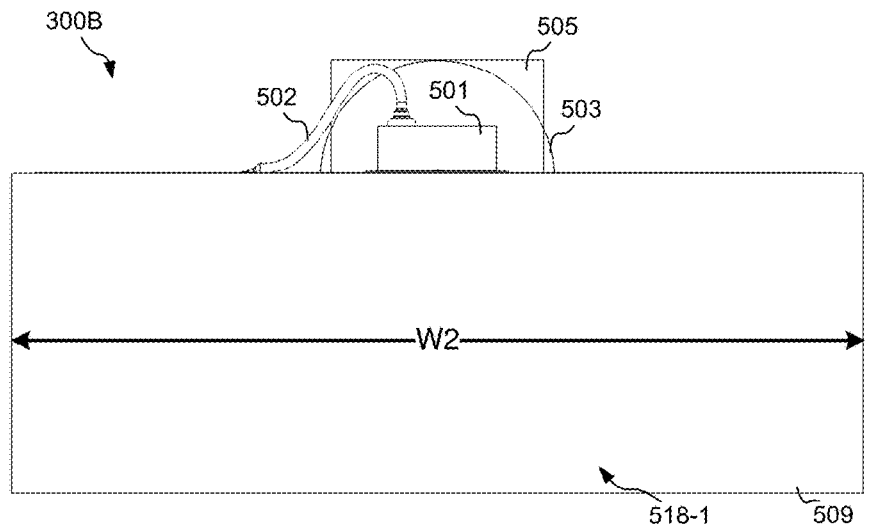
Figure 5D:
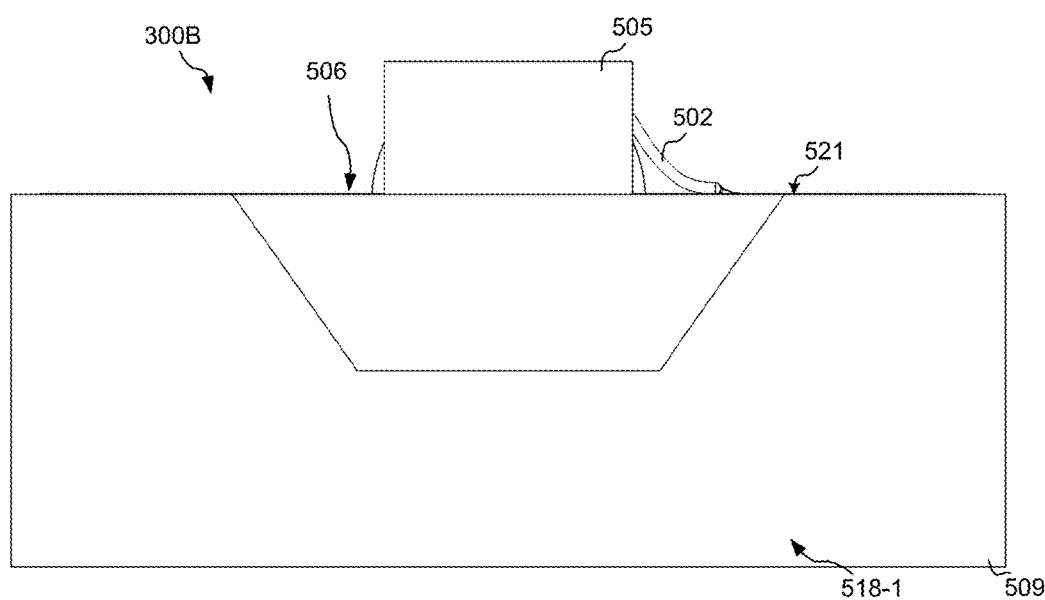
Figure 6:
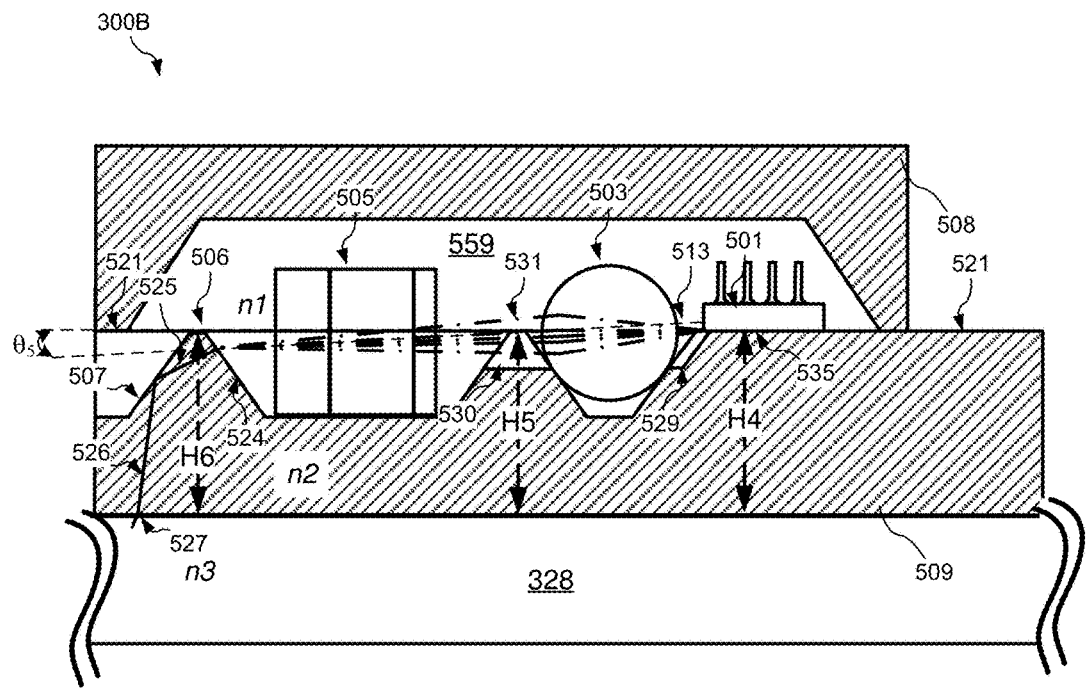
FIG. 6 shows a cross-sectional view of the light engine of FIG. 5A taken along the line 6-6 in accordance with an embodiment of the present disclosure.

Referring now to FIGS. 5A-5B, another example light engine 300B is shown in accordance with an embodiment. The light engine 300B may be suitable for use as TOSA modules within the optical transceivers of systems 100, 100' of FIGS. 1A and 1B, respectively. The light engine 300B may be structurally similar to that of the light engine 300A of FIGS. 3A-4 and include similar optical components (e.g., lens, optical isolator and laser diode), and for this reason, the entire description of which will not be repeated for brevity. In addition, the mirror device 506 may be integrally formed as a single piece with the optical bench 509. The mirror device 506 and the optical bench 509 may thus collectively form an integrated optical bench assembly.

As shown, the light engine 300B includes an optical bench 509 that provides a laser diode section adjacent the first end 518-1 to couple to a laser diode 502, followed by a lens holder section for receiving and aligning a lens 503 with laser light output by the laser diode 502, an optical isolator section for coupling to an optical isolator 505 to receive focus incident light, and a light turning (or mirror) section to provide a mirror device 506 to receive and "turn" light towards a CMOS chip, e.g., the CMOS chip 328 of FIG. 6. Accordingly, the optical engine 300B provides a coaxial configuration whereby a laser diode 502, lens 503, optical isolator 505, and a mirror device 506 are disposed along and align with a first light path 513. The surface 521 of the optical bench 509 includes electrical pads 515-1, 515-2, for electrically coupling the laser diode 502 to associated driver circuitry (not shown), such as a laser diode driver (LDD).

In an embodiment, the laser diode 501 may be formed as an epi-down bonded laser, wherein light is emitted by a surface proximate to the surface 535A. A first cavity 529 (or channel 529) is formed adjacent the laser diode chip 501 and extends into one side of the lens holder cavity 519. A second cavity 530 (or channel 530) is disposed between the lens holder cavity 519 and the optical isolator cavity 520. Thus, the light path 513 extends through the lens 503 and the optical isolator 505 by way of the first and second channels 529, 530. The mirror device 506 is disposed at an end of the light path 513 and includes an optical window 517 aligned with the first light path 513 to receive laser light and output the same to the CMOS chip 328.

Turning to FIG. 6, with additional reference to FIGS. 5A-5D, a cross-sectional view of the light engine 300B taken along the line 6-6 of FIG. 5A is shown in accordance with an embodiment of the present disclosure. One example process for forming optical bench 509 is discussed in greater detail below. As shown, the optical bench 509 includes a lid 508 to enclose at least a portion of the cavity 559. The surface 521 of the optical bench 509 extends along the longitudinal axis 516 and may form an interface with the lid 508. The optical bench 509 and lid 508 may be coupled via an epoxy, solder, or another suitable material.

In an embodiment, and as shown, the optical bench 509 includes a plurality of mesas with peaks defined by substantially flat surfaces that extend co-planar with the surface 521. For example, the laser diode section includes a fourth height H4, the first mesa 531 forming at least a portion of the lens holder cavity section includes a fifth height H5, and the second mesa defining the mirror device 506 includes a sixth height H6. In an embodiment, each of the first and second mesas include respective heights H5, H6 that are substantially equal to the fourth height H4 of the laser diode section. The first and second mesas may not necessarily have an equal height, e.g., H5 does not have to equal H6. Likewise, each of the first and second mesas may not have a height that is equal to the height H4 of the laser diode section.

In an embodiment, the overall length L2 of the optical bench 509 measures 1800 microns (μm)±20 μm. The height H4 of the laser diode section measures 675 microns (μm)±20 μm. The height H5 of the first mesa 531 may be substantially equal (e.g., within 20% or less) to the height H4 of the laser diode section, although the height H5 may be less than the height H4 of the laser diode section depending on a desired configuration. The height H6 of the second mesa, which generally defines the mirror device 506, measures 675 μm±20 μm. Thus the height H6 at which the second mesa extends from the optical bench 509 may be substantially equal to the height H4 of the laser diode section. Accordingly, the second mesa may extend to a point which is at or below an interface between the lid 508 and optical bench 509 when coupled together. In one specific example embodiment, each of the heights H4, H5, and H6 are substantially equal. In some embodiments, the ratio of the height H6 relative to the height H5 and/or the height H4 is 1:1, although other ratios are within the scope of this disclosure. For instance, the ratio of the height H6 relative to the height H5 and/or the height H4 may be within a range of ratios including 0.9:1.0 to 0.5:1.0, including all ratios therebetween.

As shown, the laser diode 501 may be configured to emit laser light along a first light path 513, with the first light path 513 extending at an angle $\theta_5$ relative to the surface 521. In contrast with the light path 313 of FIG. 4, the light path 513 may extend at an angle $\theta_5$ of about 10 degrees±5 degrees relative to a center line drawn along the longitudinal axis 516 and tangent to the surface 521. Thus the light path 513 may be referred to as a titled, or downward sloping, light path by function of the lens 503, for instance. A portion of the laser diode section may be removed to form cavity/channel 529, and a portion of the first mesa 531 may be removed to form cavity/channel 530 to allow laser light to be emitted therethrough. Accordingly, the light path 513 may extend through the channel 529 and 530 before encountering the optical isolator 505.

Continuing on, the light path 513 may then pass through the optical isolator 505 intersect with a surface 524, which may be referred to as a light incident surface 524, of the mirror device 506. As discussed above, the difference in refractive index between the medium of the cavity 559, e.g., air, and that of the mirror device, e.g., silica, can cause refraction to occur. The resulting refraction may then cause laser light to launch along a second light path 525. Laser light traveling along the second light path 525 may then be refracted based on the interface between a second surface 507, which may also be referred to as a reflective surface 507, and the medium of the cavity 559. As a result, laser light may be launched along a third light path 526, with the third light path being substantially orthogonal relative to the first light path 513. Light traveling along the third light path may then be passed into the CMOS chip 328 via light-emitting surface 527, which may also be referred to as a light-emitting interface or light output port. Based on refractive index differences between the refractive index n2 of the optical bench 509 and the refractive index n3 of the CMOS chip 328, laser light may be refracted at a desired angle. For example, some CMOS gratings are optimized to receive laser light at a 65 degree angle. Accordingly, the light engine 300B may be configured with materials having associated refractive indexes and/or angled surfaces that achieve outputting light via the light output port 527 at a particular angle which is optimized for optical coupling into an adjacent CMOS chip.

Figure 7:
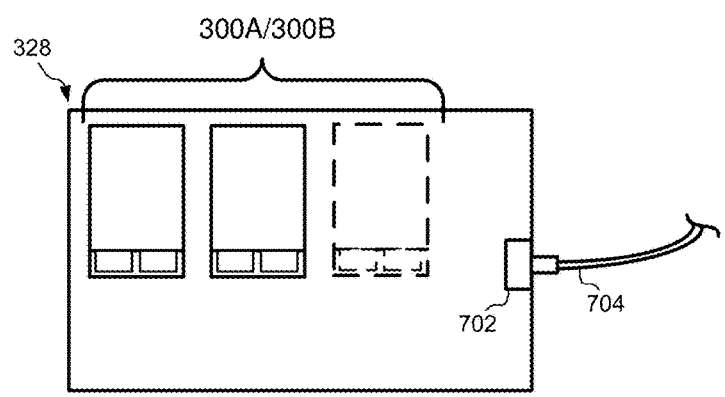
FIG. 7 shows a CMOS chip with a surface coupled to one or more light engines configured in accordance with the present disclosure.

FIG. 7 shows an example CMOS chip 328 that may be coupled to one or more light engines configured in accordance with the present disclosure. The CMOS chip 328 includes electrical pads/terminals (not shown) for electrically coupling with each light engine as well as light input ports to receive laser light. Waveguides and/or gratings formed within the CMOS chip may direct laser light to an output port 702 which may then couple laser light on to an optical fiber 704. The CMOS chip 328 may include a multiplexing arrangement, such as the AWG mux discussed above with regard to FIG. 1B, to combine different channel wavelengths received from each light engine for output. The CMOS chip 328 is not necessarily limited to use within the optical transceiver 100' and is equally suitable for use in other transceiver implementations such as the optical transceiver 100 shown in FIG. 1A.

Formation of the light engines 300A/300B may be accomplished via photolithography, including wet or dry etching, or a combination of etches if so desired. In one specific example embodiment, a hardmask, such as an oxide layer, may be patterned and etching performed to form respective mirror devices 306/506. Likewise, optical isolator cavities 320/520 and lens holder cavities 319/519 may be formed via such patterning and etching. The geometry of each of the mirror devices 306/506 and various trenches/structure of the light engines 300A/300B may vary depending the particular geometries of associated lenses and optical isolators in addition to ensuring that laser light is output by a light engine at an angle which is optimized for a particular CMOS chip. The hardmask layers may be optionally removed.

A laser diode may be mounted on surfaces 322/522. For example, the laser diode 301 may be formed as an epi-up bonded laser. On the other hand, the laser diode 501 may be formed as an epi-down bonded laser. In this case, channels 529/530 may be etched to ensure laser light emitted by the epi-down bonded laser traveling along the light path 513 is unobstructed by the optical bench 509. Electrical pads, e.g., electrical pads 314-1 . . . 314-2, 315-1 . . . 315-2, 514-1 . . . 514-2, 515-1 . . . 515-2, may be formed by depositing or otherwise growing a metal, such as Gold (Au) or another suitable metal/alloy. Likewise, the laser diode mounting surfaces, e.g., mounting surface 322, may be formed via deposition/growth of a Gold-Tin alloy (AuSn) or another metal/alloy to bond a laser diode chip.

Accordingly, light engines consistent with the present disclosure include an integrated turning device which pre-aligns the mirror device relative to an associated light path which advantageously reduces manufacturing complexity and increases yield. In addition, a light engine consistent with embodiments described herein may be formed with an epi-up or epi-down laser diode configuration.

Consistent with an aspect of the present disclosure, a light engine is disclosed. The light engine comprising an optical bench having a first end extending to a second end along a longitudinal axis, a laser diode disposed on a mounting surface adjacent the first end of the optical bench and configured to output laser light along a first light path that extends substantially along the longitudinal axis, and an integrated mirror device disposed along the light path to receive and direct the laser light along a second light path to optically couple the laser light to a photonically-enabled complementary metal-oxide semiconductor (CMOS) die, the second light path being substantially orthogonal relative to the first light path.

In accordance with another aspect of the present disclosure, a light engine is disclosed. The light engine comprising an optical bench having a first end extending to a second end along a longitudinal axis, a laser diode disposed on a mounting surface of the optical bench adjacent the first end of the optical bench and configured to output laser light along a first light path that extends substantially along the longitudinal axis, a lens holder section adjacent the laser diode, the lens holder section defining a lens holder cavity, a ball lens positioned within the lens holder cavity of the lens holder section, wherein the lens holder cavity is dimensioned such that the ball lens is positioned in substantial alignment with the laser diode to receive laser light emitted therefrom along the light path, an optical isolator section adjacent the lens holder section, the optical isolator section defining an optical isolator cavity, an optical isolator positioned within the optical isolator cavity of the optical isolator section, wherein the optical isolator cavity is dimensioned such that the optical isolator is positioned in substantial alignment with the laser diode and ball lens to receive laser light emitted therefrom along the light path, and an integrated mirror device disposed adjacent the optical isolator cavity to direct incident laser light received via the first light path on to a second light path to optically couple laser light to a photonically-enabled complementary metal-oxide semiconductor (CMOS) die, the second light path being substantially orthogonal relative to the first light path.

In accordance with another aspect of the present disclosure, a method of forming a light engine comprising is disclosed. The method comprising depositing a hardmask on a surface of a substrate, the substrate comprising silicon, and etching the substrate to form a lens holder cavity to receive and couple to a lens and an optical isolator cavity to receive and couple to an optical isolator, wherein the optical isolator cavity is at least partially formed by etching a first mesa structure into the substrate, and wherein the etched mesa structure provides an angled surface facing the optical isolator cavity and lens holder.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A light engine comprising:
   an optical bench having a first end extending to a second end along a longitudinal axis;
   a laser diode disposed on a mounting surface adjacent the first end of the optical bench and configured to output laser light along a first light path that extends substantially along the longitudinal axis;
   at least one channel defined by the optical bench that allows the first light path to extend therethrough, wherein the at least one channel includes a first channel defined by a mesa structure disposed along the light path, the channel extending through the mesa structure to allow the first light path to extend therethrough; and
   an integrated mirror device disposed along the light path to receive and direct the laser light along a second light path to optically couple the laser light to a photonically-enabled complementary metal-oxide semiconductor (CMOS) die, the second light path being angled relative to the first light path.

2. The light engine of claim 1, wherein the integrated mirror device is formed from the optical bench as a single piece.

3. The light engine of claim 1, wherein the at least one channel includes a second channel proximate the laser diode to allow the first light path to extend therethrough.

4. The light engine of claim 1, wherein the integrated mirror device is at least partially defined by a mesa structure extending from the optical bench, and wherein the mesa structure includes a first angled surface that intersects with the light path, the first angled surface to cause incident light to refract at a first angle relative to the light path.

5. The light engine of claim 4, wherein the mesa structure includes a second angled surface opposite the first angled surface, the second angled surface to cause incident laser light refracted from the first angled surface to refract at a second angle.

6. The light engine of claim 1, the light engine further comprising a lens holder cavity disposed along the light path for receiving and aligning a lens with the first light path and an optical isolator cavity for receiving and aligning an optical isolator with the first light path.

7. The light engine of claim 6, wherein the mesa structure defines at least a portion of the lens holder cavity.

8. The light engine of claim 1, wherein the laser diode comprises an epi-down laser diode.

9. The light engine of claim 1, further comprising a lid portion coupled to a surface of the optical bench.

10. A light engine comprising:
    an optical bench having a first end extending to a second end along a longitudinal axis;
    a laser diode disposed on a mounting surface of the optical bench adjacent the first end of the optical bench, the mounting surface extending along a first plane, wherein the laser diode is configured to output laser light from a light-emitting surface of the laser diode along a first light path that is angled downwards towards an integrated mirror of the optical bench such that the first light path intersects with the first plane;
    a lens holder section adjacent the laser diode, the lens holder section defining a lens holder cavity;
    a ball lens positioned within the lens holder cavity of the lens holder section, wherein the lens holder cavity is dimensioned such that the ball lens is positioned in substantial alignment with the laser diode to receive laser light emitted therefrom along the light path;
    an optical isolator section adjacent the lens holder section, the optical isolator section defining an optical isolator cavity;
    an optical isolator positioned within the optical isolator cavity of the optical isolator section, wherein the optical isolator cavity is dimensioned such that the optical isolator is positioned in substantial alignment with the laser diode and ball lens to receive laser light emitted therefrom along the light path; and
    the integrated mirror device disposed adjacent the optical isolator cavity to direct incident laser light received via the first light path on to a second light path to optically couple laser light to a photonically-enabled complementary metal-oxide semiconductor (CMOS) die, the second light path being angled relative to the first light path.

11. The light engine of claim 10, wherein the integrated mirror device is formed from the optical bench as a single piece.

12. The light engine of claim 10, wherein the lens holder cavity is defined at least in part by a first mesa structure extending from the optical bench to a height H1, and wherein the optical isolator cavity is at least partially defined by a second mesa structure extending from the optical bench to a height H2.

13. The light engine of claim 12, wherein the height H1 of the first mesa structure is substantially equal to the height H2 of the second mesa.

14. The light engine of claim 12, wherein the height H2 of the second mesa is greater than the height H1 of the first mesa.

15. A method of forming a light engine comprising:
    depositing a hardmask on a surface of a substrate, the substrate comprising silicon; and
    etching the substrate to form a lens holder cavity to receive and couple to a lens and an optical isolator cavity to receive and couple to an optical isolator,
    wherein the optical isolator cavity is at least partially formed by etching a first mesa structure into the substrate, and wherein the etched mesa structure provides an angled surface facing toward the optical isolator cavity and the lens holder cavity,
    and wherein the optical isolator cavity is defined at least in part by a second mesa structure, and wherein the method further comprises etching a portion of the second mesa structure to provide a channel therethrough, the channel extending through the second mesa structure along a longitudinal axis of the substrate.

16. The method of claim 15, wherein the angled surface is configured to receive and allow incident light to pass therethrough, and wherein the method further comprises etching a second angled surface opposite of the first, the second angled surface for receiving and refracting a substantial portion of the incident light.

17. The method of claim 16, further comprising forming an epi-down bonded laser diode adjacent the channel, the epi-down bonded laser diode configured to emit at least a portion of laser light through the channel.

18. The method of claim 15, wherein etching the substrate to form a lens holder cavity and optical isolator cavity further comprises a wet etching process.

* * * * *